219-121

7-23-74 XR 3,824,678

United States Patent [19]

Harris et al.

[11] 3,824,678

[45] July 23, 1974

[54] PROCESS FOR LASER SCRIBING BEAM LEAD SEMICONDUCTOR WAFERS

[75] Inventors: Ronald E. Harris, Placentia; Darrel F. Cullen, Costa Mesa, both of Calif.

[73] Assignee: North American Rockwell Corporation, El Segundo, Calif.

[22] Filed: Oct. 25, 1972

[21] Appl. No.: 300,548

Related U.S. Application Data

[63] Continuation of Ser. No. 68,283, Aug. 31, 1970, abandoned.

[52] U.S. Cl. .................. 29/578, 29/580, 219/121 L
[51] Int. Cl. .............................................. B01j 17/00
[58] Field of Search ............. 29/580, 582, 583, 576, 29/578, 590, 591; 219/121 LM, 121 L

[56] References Cited

UNITED STATES PATENTS 3,112,850 12/1963 Garibotti..................... 219/121 LM
3,360,398 12/1967 Garibotti..................... 219/121 LM
3,550,261 12/1970 Schroeder............................ 29/583

*Primary Examiner*—W. Tupman
*Attorney, Agent, or Firm*—H. Frederick Hamann; G. Donald Weber, Jr.

[57] ABSTRACT

Microelectronic circuits are produced in semiconductor wafers with beam leads having adhering and non-adhering portions. The non-adhering portions comprise the projecting part of the beam lead. The wafer is divided into chips having beam leads by partially cutting the wafer from the reverse side with a laser beam. The wafer is initially positioned for the laser cutting using an infrared light and a vacuum for securing the wafer at the correct position prior to the laser scribing. The uncut portion of the wafer is broken and the semiconductor chips are separated. During the separation, the non-adhering portions of the beam leads become separated from adjacent chips.

10 Claims, 6 Drawing Figures

INVENTORS
RONALD E. HARRIS
DARREL F. CULLEN

BY Robert G. Rogers

ATTORNEY

INVENTORS
RONALD E. HARRIS
DARREL F. CULLEN
BY
Robert G. Rogers
ATTORNEY

INVENTORS
RONALD E. HARRIS
DARREL F. CULLEN
BY
Robert G. Rogers
ATTORNEY

INVENTORS
RONALD E. HARRIS
DARREL F. CULLEN
BY
Robert G. Rogers
ATTORNEY

PROCESS FOR LASER SCRIBING BEAM LEAD SEMICONDUCTOR WAFERS

This is a continuation of application Ser. No. 68,283 filed Aug. 31, 1970, and now abandoned.

BACKGROUND OF THE INVENTION

1. Field of the Invention

The invention relates to a process for laser cutting beam lead semi-conductor wafers and more particularly to such a process in which the beam leads for microelectronic circuits on adjacent portions of the semiconductor wafer are produced interdigitally with an adhering and a non-adhering portion that separates from the adjacent semiconductor wafer portion when the wafer is broken into chips after the laser scribing.

2. Description of Prior Art

The prior art is represented by several patents assigned to Bell Telephone Laboratories, Inc. including U.S. Pat. No. 3,335,338, for "An Integrated Circuit Device and Method" by Martin P. Lepselter, issued Aug. 8, 1967, (CL. 317-234); U.S. Pat. No. 3,388,048, for "Fabrication of Beam Lead Semiconductor Devices" by Joseph M. Szabo, Jr., issued June 11, 1968, (CL. 204-15); and U.S. Pat. No. 3,448,510, for "Methods and Apparatus for Separating Articles Initially in a Compact Array and Composite Assemblies So Formed" to J. R. Bippus et al., issued June 10, 1969, (CL. 29-413).

The Lepselter patent describes a process for producing an array of individual microelectronic circuits in air isolated semiconductor chips interconnected by relatively thick metal leads. A circuit pattern is formed on one face of a semiconductor wafer. An oxide layer is opened for depositing metal contacts of the circuit or selected regions of the wafer. The multiple metal layers include titanium, platinum, and gold. After the microelectronic circuits including the metal interconnections have been formed, the opposite surface of the semiconductor wafer is masked and portions of the semiconductor material between individual microelectronic circuits is removed by chemical etching, mechanical or electrical bombardment techniques.

The Szabo patent teaches the formation of beam leads for microelectronic circuits formed in a semiconductor chip. The beam lead comprises layers of platinum, titanium, and gold. Photo-etching techniques are used to form the metal layers in a desired configuration. The excess semiconductor material under the beam leads is removed by etching to produce the configuration shown in FIG. 14.

The Bippus patent teaches a method and an apparatus for stretching a partially broken semiconductor wafer until the wafer separates into semiconductor chips each including a microelectronic circuit. The wafer is scribed with a diamond point and broken with a roller before being uniformly stretched. The diaphragm supporting the wafer is stretched outwardly from the center until a predetermined separation is effected among the adjacent semiconductor chips.

A detailed description of a Bell Telephone Laboratories beam lead process is contained in the article entitled "Beam Lead Technology" by M. P. Lepselter published in Volume 45, pages 233–253, of the February, 1966 Bell System Technical Journal. As indicated in the article, after the metal circuit pattern including beam lead members has been formed on the face of the wafer, the wafer slice is turned over and etched masking patterns are developed in registration with the metallized patterns on the face of the wafer. The unmasked areas are etched away leaving the individual chips with cantilevered beam leads.

A beam lead forming process is preferred which can separate the portions of a semiconductor wafer containing individual microelectronic circuits and semiconductor chips having beam leads without the necessity for chemical etching or scribing and without excessive loss of semiconductor material. Such a process should enable the beam leads to readily separate from adjacent chips and without contamination of the circuits. The present invention provides such a process.

SUMMARY OF THE INVENTION

Briefly, the invention comprises a process for forming interdigitated beam lead members on a semiconductor wafer, each having an adherent and a relatively non-adherent portion. The adherent portion remains connected to a chip after the wafer is separated into chips and the non-adherent portion easily separates from the adjacent chip.

The semiconductor wafer is partially divided, or cut, into semiconductor chips by a laser beam focused on the back surface of the wafer. The chip is initially positioned using infrared light. After it has been positioned relative to a reference set of coordinates, it is held in that position then moved along X and Y axes under the laser beam. The semiconductor wafer is then broken into chips and separated.

In the preferred embodiment, the non-adhering beam lead portion is produced by plating gold or an equivalent metal over a relatively thin layer of chromium which has a relatively passivated surface. The gold plates readily on the relatively passivated surface but lightly adheres to the surface so that it is easily separated when the wafer is broken and separated.

Therefore, it is an object of this invention to provide an improved process for forming beam leads by using a laser beam for partially dividign the semiconductor wafer into a plurality of semiconductor chips.

Another object of this invention is to provide a process for producing beam leads having an adhering and a relatively non-adhering portion wherein the non-adhering portions connected to adjacent semiconductor chips of a semiconductor wafer become easily separated.

A still further object of this invention is to provide a beam lead process in which the beam leads for adjacent semiconductor chips of an unseparated semiconductor wafer are interdigitated for reducing semiconductor material loss and each include an adhering and non-adhering portion with the non-adhering portion being connected to the adjacent chip so that it is easily separated.

A still further object of this invention is to provide a beam lead process using a laser beam for cutting the semiconductor wafer into individual chips and in which the gold or equivalent metal of a beam lead is made relatively non-adhering to an adjacent chip by passivating an underlying relatively thin chromium (or equivalent) layer.

A further obect of this invention is to provide a beam lead process using laser scribing, and interdigitated beam leads providing electrical connections to microelectronic circuits wherein the semiconductor material normally removed in forming chips from a semiconductor wafer is substantially reduced.

A further object of this invention is to provide a beam lead producing process in which beam leads for adjacent microelectronic circuits are produced in an interdigitated manner for increasing the usable semiconductor area of a semiconductor wafer.

A still further object of this invention is to provide a beam lead process using laser cutting, interdigitated beam leads, and a stretching technique for separating the semiconductor wafer into individual semiconductor chips.

These and other objects of this invention will become more apparent when taken in connection with the description of the drawings, a brief description of which follows:

DESCRIPTION OF PREFERRED EMBODIMENTS

Figure 1:
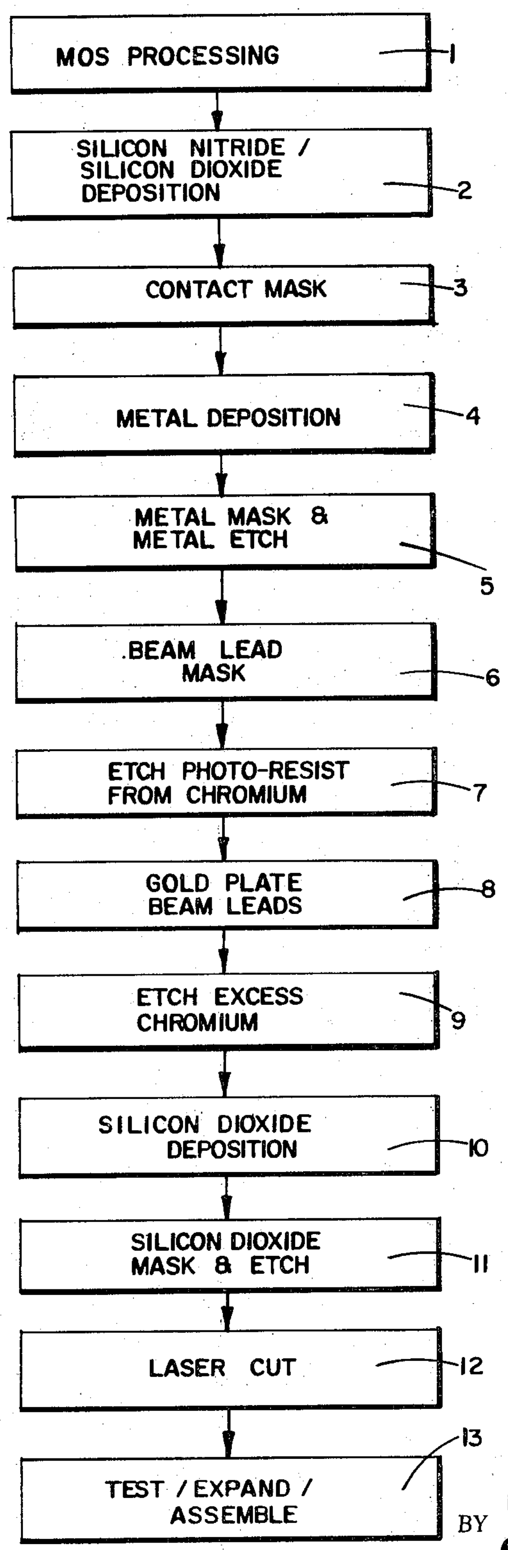
FIG. 1 is a block diagram of the steps of one embodiment of the beam lead process.

FIG. 1 is a block diagram of the steps of one process for producing beam leads. In Step 1, a semiconductor wafer such as N-type silicon is appropriately masked and impurities are diffused into the unmasked regions for forming PN junction and N+ regions in the semiconductor wafer as part of a P-MOS or C-MOS process. The diffusion step also produces a thermally grown oxide layer such as $SiO_2$ on the wafer surface.

It is pointed out that devices other than MOS devices can also be produced within the scope of the invention. For example, MNOS devices, silicon gate devices and other devices known to persons skilled in the art can also be produced. When interconnected, the devices form individual microelectronic circuits on separate portions of the semiconductor wafer. The independent wafer portions are subsequently separated into semiconductor chips. In Step 2, a passivating film such as silicon nitride is deposited over the $SiO_2$ layer on the semiconductor wafer. In one process, a silicon nitride film may be deposited by reacting silane and ammonia in a hydrogen ambient. The wafer is maintained at a required temperature in an inductively heated reactor. A silicon nitride film having a thickness of, for example, 350A provides an adequate contamination barrier for the wafer.

In addition an insulating film such as silicon dioxide is reactively deposited on top of the silicon nitride film for use as an etch mask. A film of, for example 1,000A, is satisfactory for that purpose. Silicon dioxide may be deposited, for example, by reacting silane with oxygen in a nitrogen ambient. However, other techniques may also be used to deposit the silicon dioxide film.

In Step 3, a layer of photoresist is deposited over the silicon dioxide film and developed for exposing certain areas of the silicon dioxide. The exposed silicon dioxide areas are etched with a standard etchant to expose the silicon nitride layer which is also etched, for example, with a hot phosphoric acid etchant. The underlying thermally grown silicon dioxide layer is then removed by a standard etchant for exposing the silicon wafer surface. The exposed surface areas define contact regions. For example, the contact regions may comprise a source or drain electrode for a field effect transistor. A gate electrode can be deposited over a region silicon dioxide layer.

After portions of the semiconductor wafer surface have been exposed, a conducting metal layer such as aluminum is deposited, for example, by vacuum techniques, masked and etched to form metal contacts and the conductors for the individual circuit patterns of a plurality of microelectronic circuits formed in the wafer. Subsequently, the semiconductor wafer is divided into semiconductor chips each including a microelectronic circuit. The masking and etching techniques for forming the metal contacts and circuit conductors are well known to persons skilled in the art.

In Step 4, silicon dioxide ($SiO_2$) layer is chemically vapor deposited over the entire semiconductor wafer surface for mechanically protecting the conductors and contacts of the microelectronic circuits. The $SiO_2$ layer is masked and etched to expose contact regions about the peripheries of each microelectronic circuit. Subsequently, a relatively thin chrome layer is deposited over the entire wafer surface and on the exposed aluminum contacts. A chrome layer may be evaporated from a molybdenum container on the wafer maintained at a temperature of approximately 200° C and at a pressure of approximately $10^{-6}$ Torr. A thickness of approximately 1,000A is satisfactory.

Without removing the semiconductor wafer from the vacuum chamber, a second metal layer such as copper is deposited on the chrome layer. Palladium or silver may also be deposited on the chromium layer. Copper can be evaporated to a thickness of approximately 4,000A. Following the copper deposition, a third metal, such as gold, is vacuum deposited over the copper layer. The gold may have a thickness of approximately 4,000A. The copper layer separates the chrome and gold layers for preventing the two layers from diffusing together. The aluminum layer also prevents the copper layer from contaminating the silicon wafer.

Chrome may be deposited directly onto the wafer surface as the contact and circuit metal. In that case, it is not necessary to use a copper layer. Palladium or silver can be used in that embodiment to separate the chrome layer from the gold layer. The circuitry and contacts for the microelectronic circuit includes the chrome, palladium or silver, and gold metal layers. Obviously, the palladium or silver and gold have a higher electrical conductivity than chrome.

After the gold layer has been deposited, it is masked with a photo resist material and etched. Similarly, the copper layer is also masked and etched. The chromium layer is not etched for reasons described subsequently. Etchants for gold and copper are well known to persons skilled in the art. The unetched portions of the gold and copper are disposed over the metal contacts about the peripheries of the independent microelectronic circuits. In other words, the unetched portions are within the boundaries of the areas of the semiconductor wafer which will become semiconductor chips when the wafer is scribed as described subsequently.

In Step 6, the semiconductor wafer is coated with a photoresist and exposed through a mask to define beam leads about the peripheries of the individual microelectronic circuits. The unexposed portions of the photoresist material are removed such as by rinsing. However, the exposed chrominum layers are etched for a few seconds using, for example, a potassium hydroxide or potassium permanganate etchant. The etched surface is rinsed by water immediately after the etching step for partially passivating the surface. The chrome surface may be either completely cleaned or completely covered by an oxide layer. The oxide surface forms an insulating layer which interferes with the plating of gold. If the surface is completely cleaned of oxides etc. the gold plates well on the chrome surface but is adhering and sticks. What is required therefore is a relatively passivated surface that is, i.e. a surface less than completely cleaned and less than completely passivated (covered by an oxide layer). The slight oxide layer covering the chrome after the water rinse is usually sufficient to partially passivate the chrome surface. The gold only slightly adheres i.e. is relatively non-adherent to the relatively passivated surface. The non-adherent nature of gold on a passivated chrome surface enables the beam lead for adjacent microelectronic circuits in the wafer to be produced in an interdigitated manner.

In Step 8, the exposed portions of the wafer surface including the unetched gold, copper and chromium layers are electro-plated with for example gold. Electroplating techniques known to persons skilled in the art may be used to plate the gold through a suitable mask on the wafer surface to a thickness of, for example, 120,000A.

Figure 2:
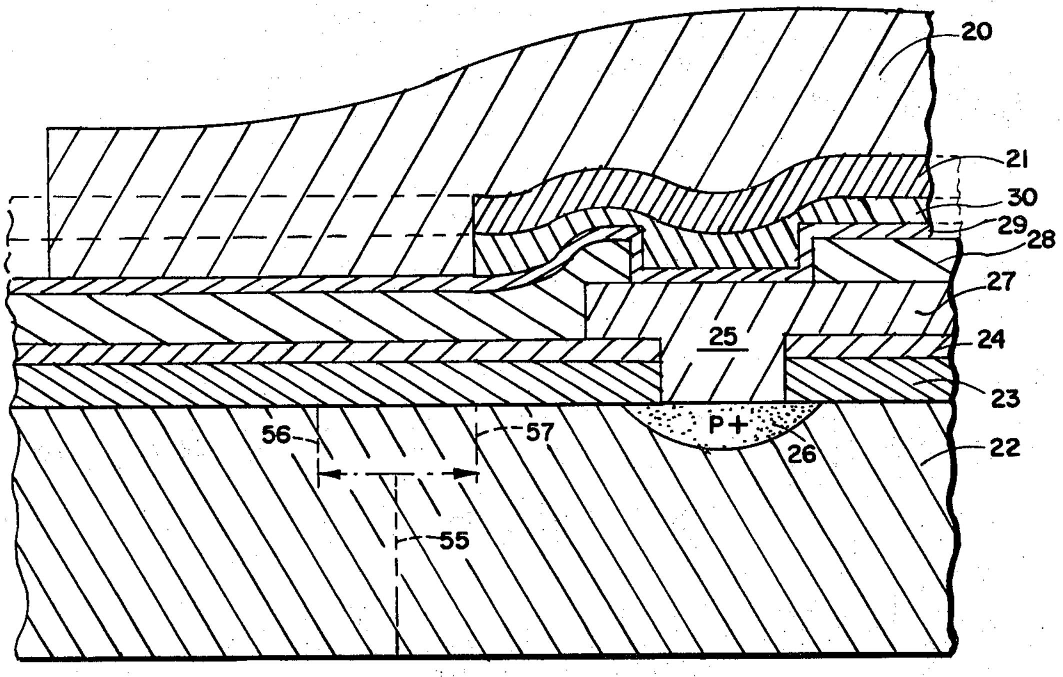
FIG. 2 is a cross-sectional view of a portion of a semiconductor wafer showing the adhering and nonadhering portions of a beam lead.

In Step 9, the remaining photoresist, is removed from the wafer and the chrome not covered by the gold plated beam leads is removed for example by etching. FIG. 2 is a cross-sectional view of one portion of a semiconductor wafer such as silicon on which a beam lead has been formed. The figure is not drawn to scale. For example, the gold plated beam lead 20 does not have a thickness equivalent to 120,000A when compared with the underlying vacuum deposited gold layer 21 described as having a thickness of approximately 4,000A. Similarly, the semiconductor wafer 22 which may be 10 mils thick is substantially thicker than the gold plated beam lead 20.

Also shown in FIG. 2 is the layer 23 of silicon dioxide on top of the surface of the silicon wafer. Passivating layer 24 of silicon nitride is shown disposed on top of the silicon dioxide layer.

As described in connection with Step 3, the silicon nitride silicon oxide layers are suitably masked and etched for exposing contact areas of the silicon wafer surface. For the particular embodiment shown the aluminum contact 25 is shown on top of a P region 26 formed during Step 1 of the process. The aluminum contact 25 is integral with a conductor portion 27 which interconnects the P region 26 with other parts of a microelectronic circuit which is not completely shown. The $SiO_2$ layer 28 deposited in Step 3 is shown with an opening over contact 25.

FIG. 2 also shows consecutively deposited layers 29, 30 and 21 on top of the silicon dioxide layer 28. Subsequently, the excess portions shown by the dotted lines were masked and removed. The dotted portion of the chrome layer 29 was removed in Step 9 after the beam leads illustrated by beam lead 20 were formed.

Steps 10 and 11 are required for a different embodiment of the process. In other words, when aluminum is used as the contact metal covered by sequential layers of chrome, copper and gold, steps 10 and 11 are not required. However, when chrome is used in place of aluminum, and sequential layers of palladium or silver, and gold are plated on top of the chrome, steps 10 and 11 are necessary. In addition, the $SiO_2$ deposition, masking and etching part of step 4 would be omitted.

In Step 12, the wafer is turned over and positioned on an XY positioning table at a reference set of coordinates. After the wafer has been positioned, the XY positioning table, which is programmable to move at a certain rate and along certain coordinates, is actuated for moving the wafer under a laser beam. For example, an XY positioning table may be moved under a stationary laser beam in response to a punched tape program.

In a preferred embodiment, the wafer is positioned by using an infrared microscope equipped with crosshairs. The wafer is turned upside down on a chuck, which is positionable along X and Y coordinates and which has a theta ($\theta$) adjust. The infrared scanner enables an operator to see through the silicon chip which is preferably placed on a porous disc of material such as alumina, quartz, ceramic, etc.

The work table is adjusted for positioning the wafer relative to the cross-hairs of the infrared scope. Ordinarily, one portion of a wafer is left blank for establishing a reference position. After the wafer has been positioned, a vacuum pump is actuated for securing the wafer on top of the porous disc. The assembly is then transferred to the XY positioning table which as indicated above can be programmed to move along any required coordinates. In one embodiment, the XY positioner moves the wafer along the Y axis until all Y axis cuts have been made. The wafer is then moved along the X axis until all the X axis cuts have been made.

As is well known, the laser comprises a coherent beam of light or photons. The laser is focused for cutting through approximately 90% of the thickness of the wafer. For example, if the wafer has a thickness of 10 mils, the laser is focused to cut to a depth of approximately 9 mils. A Q-switched laser having a repetition rate of 1,200 pps may be used.

Figure 3:
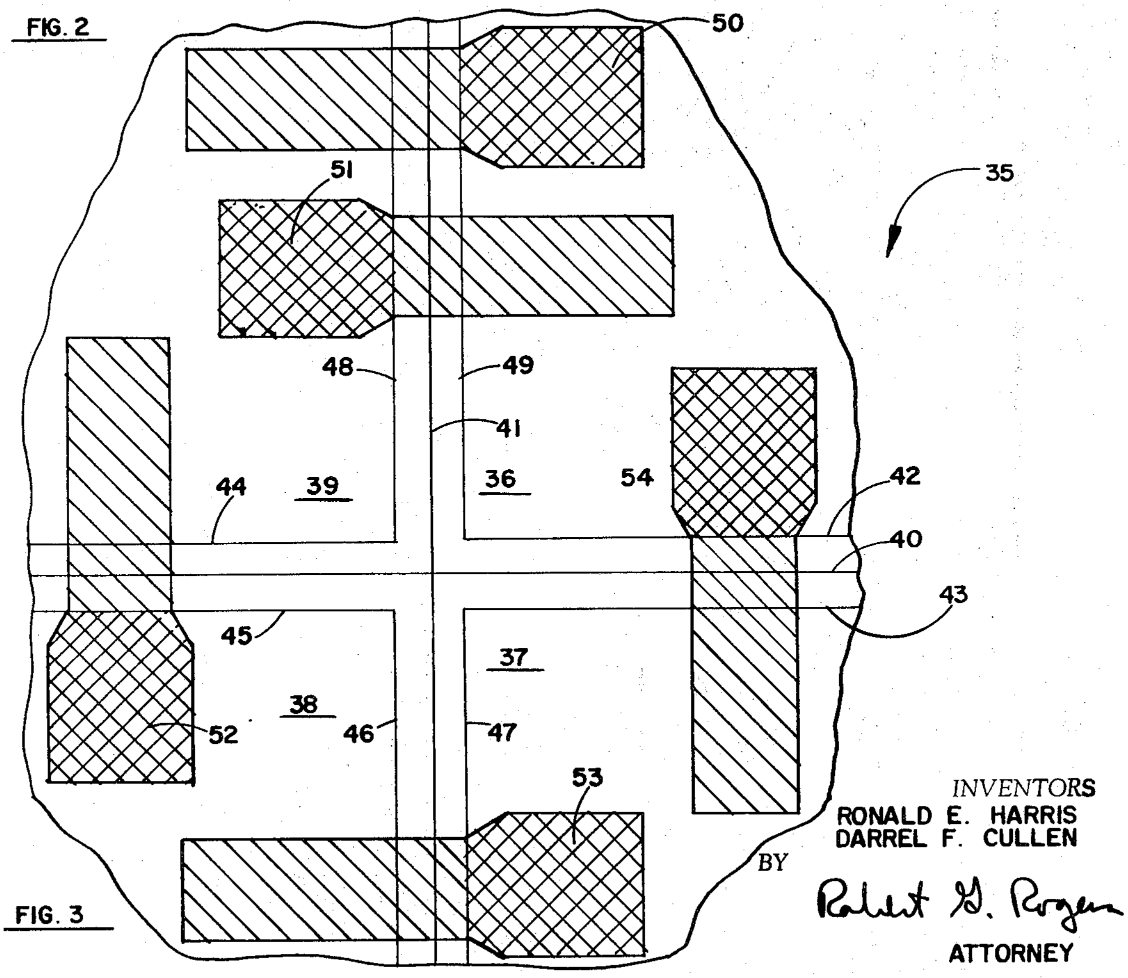
FIG. 3 is a top view of a portion of a semiconductor wafer showing the scribe lines and the interdigitated position of beam leads for microelectronic circuits on adjacent semiconductor wafer portions.

FIG. 3 is a top view of a portion of a semiconductor wafer 35. The wafer is shown divided into portions 36, 37, 38, 39 which become separated as chips during the beam lead forming process. The laser scribe lines for the X and Y axes are identified by the numerals 40 and 41. Actually, the lines do not appear on the semiconductor wafer. They are drawn in FIG. 3 to illustrate the position of the cut relative to the beam leads. Lines 42, 43, 44, 45, 46, 47, 48, and 49 illustrate the allowable deviation from the cut lines 41 and 40. In other words, the XY positioning table may have an error that would cause the cut to deviate from line 41 by the amount equal to the distance from 41 to 48 or from 41 to 49 without causing any damage. The distance between lines 48 and 49 and the other lines may be 2 mils. The distance between the lines is a function of the accuracy of the system used to perform the laser cut.

FIG. 3 also illustrates the adhering and non-adhering portions of the beam leads identified by numerals 50, 51, 52, 53, and 54. The relatively wide portions of the beam leads adhere to their associated semiconductor wafer portions. The relatively long and narrow portions comprising the beam, or cantilevered, portion of the beam lead lightly adhere to the adjacent portion of the semiconductor wafer. The distance between lines 48 and 49, for example, is determined by the spacing of the adhering portions of the beam leads for adjacent microelectronic circuits. If the laser deviated more than the distance shown between the lines, for example lines 48 and 49, the wafer could be cut in such a manner as to cause a removal of the semiconductor material from under the adhering portion of a beam lead.

FIG. 2 illustrates the adhering portion of the beam lead as being that portion of the gold plated layer 20 in contact with gold layer 21, and copper layer 30. The non-adhering portion of the beam lead is identified by that portion of the gold plated layer 20 directly on top of the surface of the passivated chrome layer 29. The cut line is identified by the dashed line 55. The distance between the lines 56 and 57 is the maximum allowable deviation of the laser cut from the line 55. Since the laser cut must be within certain predetermined maximum limits, the positioning of the wafer on the XY positioning table is relatively important. For that reason, the infrared scope is used in the preferred positioning step.

Figure 4:
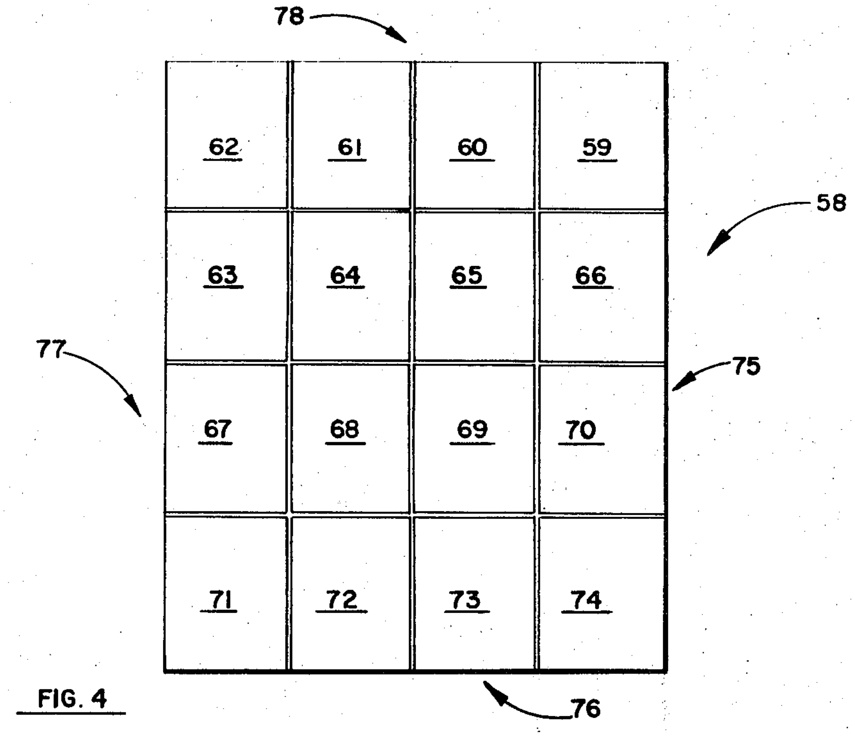
FIG. 4 is a view of the reverse side of the semiconductor wafer showing the partially scribing of the wafer into individual semiconductor chips using a laser beam.

FIG. 4 is an illustration of the reverse side of a portion of a semiconductor wafer 58 partially cut into semiconductor chips 59 through 74. Obviously, the number of microelectronic circuits formed in the wafer determine the number of chips and the cuts made by the wafer. For purposes of illustrating one embodiment, FIG. 4 shows a wafer 58 as being divided into 16 chips. The beam leads about the periphery of the chips are identified generally by numerals 75, 76, 77 and 78. The beam leads about the interior peripheries of the chips are not visible in FIG. 4.

In Step 13 of the process, as illustrated in FIG. 1, the individual microelectronic circuits are tested by the application of a probe to the pads and beam leads as is well known to persons skilled in the art. Ordinarily, such tests are carried out automatically by the application of a multi probe fixture to the pads and beam leads of each chip. The test results are recorded and the testing cycle is continued until all the individual circuits have been tested.

Following the tests in Step 13, the semiconductor wafer is broken into individual chips. Breaking techniques are well known to persons skilled in the art. In one embodiment, the wafer can be placed between two relatively flexible sheets of plastic and rolled over a cylindrical roller for breaking the wafer into chips. Lint free paper as well as rubber and other flexible materials can also be used. In addition, techniques rather than rolling can be used to separate the wafer into individual chips.

In one embodiment, the wafer is then placed on a stretchable plastic sheet. The apparatus and process described in the previously referenced Bippus patent may be used for that purpose. However, it should be understood that the process is not limited to the technique shown in the Bippus patent. The stretching step may be omitted entirely. The stretching step is used to separate the chips further after the wafer is broken. The increased separation between each of the chip enables the chips to be more easily handled for example by a vacuum probe.

Figure 5:
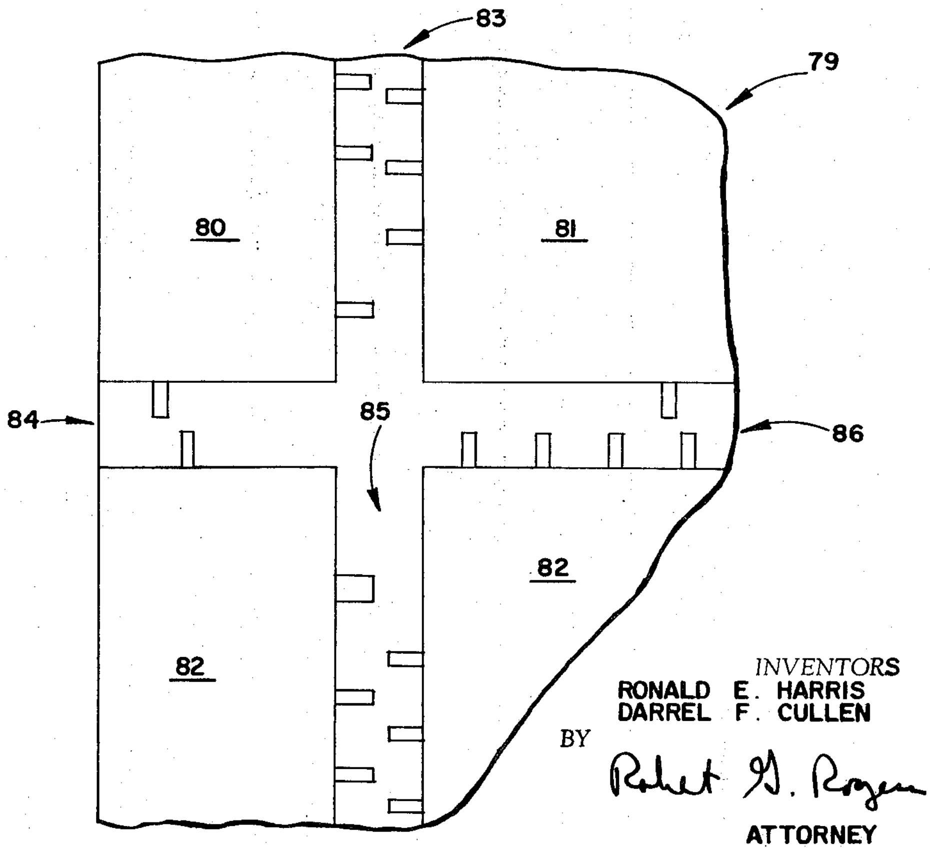
FIG. 5 is an enlarged view of a semiconductor wafer after the wafer has been broken into individual chips and stretched so that the chips are separated.

After the wafer has been separated, it may appear as shown by wafer 79 partially shown in FIG. 5. FIG. 5 illustrates portions of chips 80, 81, 82, and 83 from the reverse side. Beam leads for the adjacent chips are identified generally by numerals 83, 84, 85 and 86. The chips are separated by an amount sufficient to enable one chip to be lifted from the group of chips without having the beam leads contact the beam leads of adjacent chips. In that way, the potential damage to the beam leads is minimized.

As indicated above, the individual chips can be lifted from the group of chips by a vacuum probe and placed on a circuit board such as an aluminum substrate. The beam leads may be attached to the circuit board by conventional bonding techniques such as thermocompression or ultrasonic bonding as is well known to persons skilled in the art.

Figure 6:
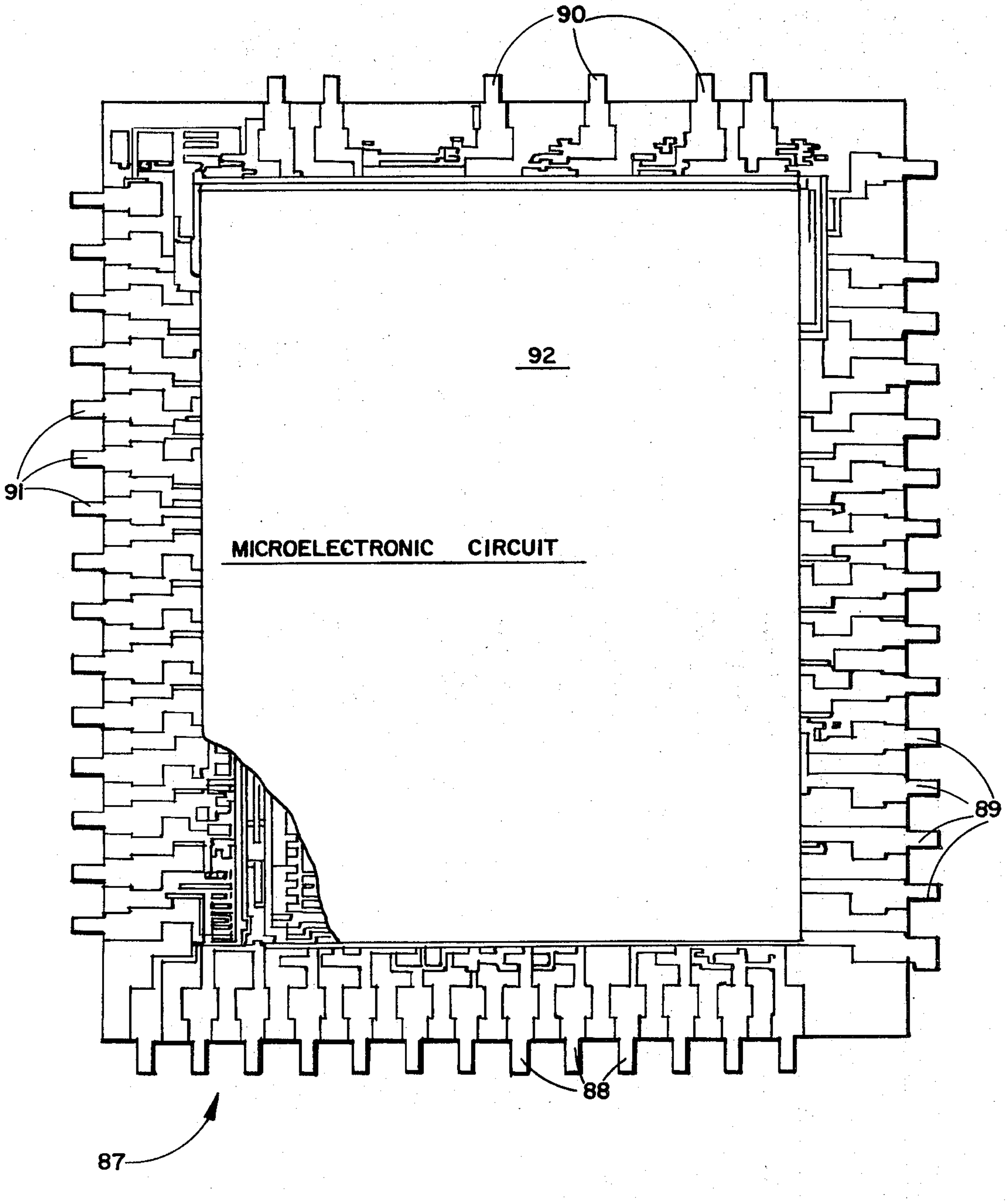
FIG. 6 is a top view of an individual semiconductor chip including projecting beam leads.

A final semiconductor chip including beam leads is illustrated in FIG. 6 as chip 87. The beam loads are identified generally be numerals 88, 89, 90 and 91. The microelectronic circuit such as an integrated circuit is not shown in detail for convenience. It is identified by numeral 92 and is labelled. When the semiconductor chip is attached to a printed circuit board, for example, the protruding portions of the beam leads are bonded to pads on the printed circuit boards.

By using the technique described herein, i.e. laser scribing, interdigitated layout for beam leads, as illustrated in FIG. 3, substantial semiconductor material can be preserved. By forming one portion of the beam lead in a relatively non-adhering manner on an adjacent chip, it is possible for the beam leads of adjacent chips to be formed adjacent to each other in the interdigitated manner illustrated in FIG. 3.

Although a preferred process has been described for metal layers consisting of aluminum, chromium, copper, gold, with silicon nitride and silicon dioxide being used as the passivating and isolating layers, other metallic and insulating layers and processes are also within the scope of the invention. The exact types of metals as well as the semiconductor materials used may vary depending upon the requirements of a particular application. In addition, the configuration of the beam leads may vary. It should be obvious that the process described herein for producing adhering and non-adhering beam lead protections on adjacent semiconductor areas each including individual microelectronic circuits and the laser scribing, can be used regardless of the type of metals and/or semiconductor materials used. Other metals that can be used in place of gold as the relatively thick beam lead metal include aluminum, nickel, and copper. In addition, titanium and other equivalent metals can be used in place of the relatively thin chrome layer.

We claim:

1. A process for producing beam leads on a semiconductor wafer divisible into semiconductor chips each including beam leads, said process comprising, forming aluminum contact regions in adherence with selected semiconductor areas, depositing a chromium layer over the surface of said semiconductor wafer and on the aluminum contacts, selectively masking and etching said chromium layer to form a pattern for beam leads, the unetched portions of said chromium layer forming an interdigitated pattern for said beam leads wherein alternate beam leads of said beam lead patterns are associated with adjacent semiconductor areas defining semiconductor chips, the portions of said chromium layer over said aluminum contacts being protected from the etchant, the remaining portion of said unetched chromium layer being subjected to a relatively short etching period for passivating the surface of said chromium layer, depositing a relatively thick gold layer on the remaining portions of said chromium layer including the passivated portions and the protected portions over said aluminum contacts, said gold layer forming the outer surface of said beam lead members, cutting said semiconductor wafer with a laser beam including a line corresponding to the line between the passivated and the non-passivated chromium portions, said laser beam cutting partially through the thickness of the semiconductor wafer, and separating the partially cut semiconductor wafer into individual semiconductor chips and separating the chromium layer along said line, the relatively thick gold layer becoming separated from the passivated surface of said chromium layer while adhering to the non-passivated surface of said chromium layer on said aluminum contacts for forming beam leads protruding from the semiconductor chip.

2. A process for producing beam leads on electronic circuit devices, said process comprising producing a first oxide layer of said electronic circuit device, producing a passivating film on said oxide layer, masking and etching said oxide layer and said passivating film to expose at least a portion of said electronic circuit device, producing an electrically conductive metal layer over said passivating film and said exposed portion of said electronic circuit device, masking and etching said electrically conductive metal layer to form at least one metal contact region associated with a circuit on said electronic circuit devices, producing a second oxide layer over the entire electronic circuit device including the contact regions previously formed in said electrically conductive metal layer, masking and etching said second oxide layer to expose selected portions of said contact regions formed in said electrically conductive metal layer, producing a second layer of metal on said electronic circuit device covering said second oxide layer and said electrically conductive metal layer, producing a third layer of metal on said second layer of metal, masking and etching said third layer of metal to expose portions of said second layer of metal, masking said electronic circuit device including said exposed portions of said second layer of metal such that portions of said second and third layers of metal are defined to serve as beam leads between separate areas of said electronic circuit device, lightly etching the previously exposed surface of said second layer of metal to partially passivate the surface thereof, producing a fourth layer of metal upon the microelectronic circuit whereby the passivated portion of said third layer and said fourth layer form a relatively non-adherent bond therebetween, removing the portions of said second layer of metal which are not covered by said third or fourth layers of metal, cutting the reverse side of said microelectronic circuit device with a laser beam including a line corresponding to the line between the passivated and the non-passivated portions of said second layer of metal, said laser beam cutting partially through the thickness of said microelectronic circuit, and separating the partially cut electronic circuit device into individual circuits and separating the second layer of metal along said line, the relatively thick fourth layer of material becoming separated from the passivated surface of said second layer of metal while adhering to the non-passivated surface of said second layer on said first layer of metal contacts for forming beam leads protruding from the microelectronic circuit device.

3. The process recited in claim 2 wherein said electrically conductive metal is selected from aluminum, chromium, silver, copper.

4. The process recited in claim 2 wherein said second layer of metal consists of chromium, chromium and copper, chromium and silver or chromium and palladium.

5. The process recited in claim 2 wherein said third and fourth layers of metal consist of gold.

6. The process recited in claim 2 wherein said oxide layers consist of silicon dioxide.

7. The process recited in claim 2 wherein said passivating film comprises silicon nitride.

8. The process recited in claim 2 wherein the step of lightly etching the previously exposed surface of said second layer of metal produces a slight oxide layer on said previously exposed surface of said second layer of metal.

9. The process recited in claim 2 wherein said first oxide layer is produced by thermal growing, said passivating film is produced by deposition at an elevated temperature, said electrically conductive metal layer is vacuum deposited, said second oxide layer is produced by chemical vapor deposition, said second layer of metal is produced by vapor deposition at an elevated temperature, said third layer of metal is produced by vacuum deposition, and said fourth layer of metal is produced by electro plating.

10. The process recited in claim 2 for producing an electronic circuit device having beam leads between selected areas thereof, said device comprising a wafer of semiconductor material, a layer of an oxide of said semiconductor material formed thereon, a passivation layer comprising a nitride compound formed on said layer of an oxide, a layer of metal deposited on said passivation layer and through apertures in said passivation layer to said wafer, a second layer of oxide formed over said passivation layer and over portions of said layer of metal, a layer of chromium formed on said second oxide layer and on said layer of metal not covered by said second oxide layer, and a further layer of metal formed on said layer of chromium such that only portions of said further layer of metal and said layer of chromium form an adherent bond therebetween.

* * * * *